United States Patent [19]

Yamakoshi

[11] Patent Number: 4,504,141

[45] Date of Patent: Mar. 12, 1985

[54] SYSTEM FOR MAKING MATCHED BACKGROUNDS

[76] Inventor: Noby Yamakoshi, 1133 S. Wabash Ave., Chicago, Ill. 60605

[21] Appl. No.: 511,571

[22] Filed: Jul. 7, 1983

[51] Int. Cl.³ .................... G03B 27/32; G03F 3/08
[52] U.S. Cl. ................................. 355/77; 358/80
[58] Field of Search ............. 355/71, 77; 358/75, 358/80

[56] References Cited

U.S. PATENT DOCUMENTS

| | | | |
|---|---|---|---|
| 4,081,828 | 3/1978 | Jones et al. | 358/75 |
| 4,189,741 | 2/1980 | Klopsch | 358/804 |
| 4,225,224 | 9/1980 | Balasubramanian | 355/77 |
| 4,342,046 | 7/1982 | Kamata | 358/75 |
| 4,346,402 | 8/1982 | Pugsley | 355/77 X |
| 4,419,691 | 12/1983 | Sing et al. | 358/75 |

Primary Examiner—Richard A. Wintercorn
Attorney, Agent, or Firm—Armstrong, Nikaido, Marmelstein & Kubovcik

[57] ABSTRACT

A method for making matched backgrounds for images of objects with the backgrounds having continuously varied gradations of tone. A continuous tone step tablet negative is positioned on a scanning drum of a laser scanning device. A piece of lithographic film is positioned on a receiving drum of the laser scanning device. A first photo mechanical screen is positioned over the piece of film. An image of the continuous tone step tablet negative is transfer-scanned to the piece of film through the screen while enlarging from 225% to 1800% of original size. The above steps can be repeated using different screen angles for producing sufficient plates for desired color combination. The pieces of film are then developed. The piece of film can be masked at a desired location with the mask appropriate to the image of the object. The developed pieces of film can be printed each with a different color ink to produce the backgrounds.

4 Claims, 4 Drawing Figures

SYSTEM FOR MAKING MATCHED BACKGROUNDS

BACKGROUND OF THE INVENTION

The present invention relates to a process for producing matched backgrounds for images of objects having continuously varied gradations of color tone.

In advertising, such as product brochures or catalogs, it is desirable to surround the image of the object to be sold with a color background. The colors of the background are often selected to complement the object. For visual effect, a background that varies from light to dark from the bottom of the picture to the top or from one side of the picture to the other side is more desirable than a plain solid color background.

However, achieving a background having continuously varied gradations of tone is difficult to accomplish. Further, when several images of objects appear on the the same page of a product brochure or catalog, it is extremely difficult to have all of the backgrounds of the different images match each other.

Conventionally, backgrounds for images have been produced on individual pieces by an artist utilizing a conventional brush or air brush to individually color around the objects or images of the objects. Utilizing such a procedure, it is extremely tedious and very difficult to produce matched backgrounds. Further, such a conventional system is extremely expensive to produce more than one set of images having backgrounds.

In order to produce multiple copies of images having backgrounds, conventionally a single original is produced and thereafter photographed. The negative produced by the photographing is then conventionally enlarged or diminished while being projected on to a piece of lithographic film with a conventional photo mechanical screen over the piece of film. The film is then developed to produce a printing plate. The plate is then printed. Any irregularities or non-uniformities in the original are, of course, reproduced in the copies.

OBJECTS AND SUMMARY OF THE INVENTION

It is an object of the present invention to produce a method for making matched backgrounds for images of objects with the backgrounds having continuously varied gradations of tone.

It is a further object of the present invention to provide a method whereby product brochures or catalogs illustrating objects can be produced with all of the backgrounds surrounding the objects being identical.

It is still a further object of the present invention to provide a process for making matched backgrounds for images of objects which is relatively inexpensive and simple to perform.

These and other objects are attained in a method for making matched backgrounds for images of objects with the backgrounds having continuously varied gradations of tone comprising the following steps:

A continuous tone step tablet negative is positioned on a scanning drum of a conventional electronic laser scanning device. A piece of lithographic film is positioned on a receiving drum of the laser scanning device. A first photo mechanical screen is positioned over the piece of film on the receiving drum. An image of the continuous tone step tablet negative is transfer-scanned to the piece of film through the screen while being enlarged from 225% to 1800% of the original size. The piece of film is replaced with a second piece and a second screen, and the image of the continuous tone step tablet negative is once again transfer-scanned to the new piece of film through the screen while being enlarged. Different screen angles are used for each piece of film to produce sufficient printing plates for the desired color combination. The pieces of film are then developed.

Between the step of positioning the piece of film on the receiving drum and positioning the screen thereover, the piece of film can be masked at a desired location with a mask appropriate to the image of the object. The developed pieces of film or printing plates can then be printed, each with a different color ink to produce the background desired.

BRIEF DESCRIPTION OF THE DRAWINGS

The above and other objects and the attendant advantages of the present invention will become readily apparent by reference to the following detailed description when considered in conjunction with the accompanying drawings wherein.

DETAILED DESCRIPTION OF PREFERRED EMBODIMENT

Figure 1:
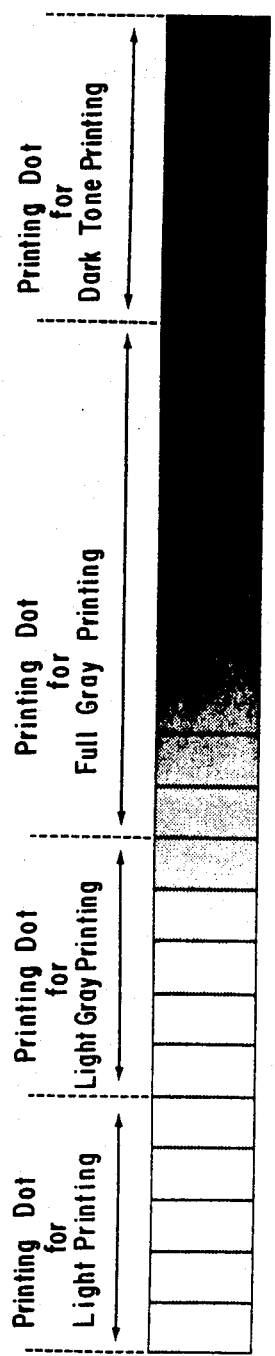
FIG. 1 shows a continuous film step tablet utilized in the process of the invention.
Figure 3:
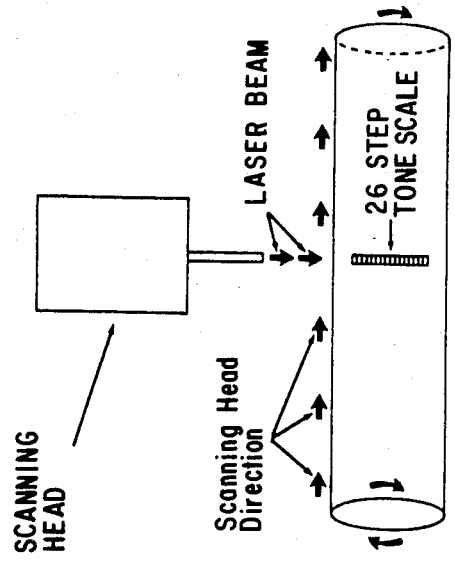
FIG. 3 illustrates another step of the process of the present invention wherein an image of the continuous tone step tablet negative is transfer-scanned to the piece of film through the screen while being enlarged.

The present invention is a photoengraving process to create a gradation of any color in the rainbow accurately and reproduceably. The equipment necessary for performing the present invention is all conventional in the graphic arts industry. Specifically, a continuous tone step tablet negative ranging from solid black through tones of gray to clear white such that shown in FIG. 1 is readily available. Electronic laser scanners and enlargers are well known in the art and utilize as shown in FIG. 3 a scanning head, a laser beam produced by the scanning head, a scanning drum and a receiving drum. Lithographic films for producing printing plates are very well known in the art. Conventional photo mechanical screens having differing screen angles are also very well known.

Figure 4:
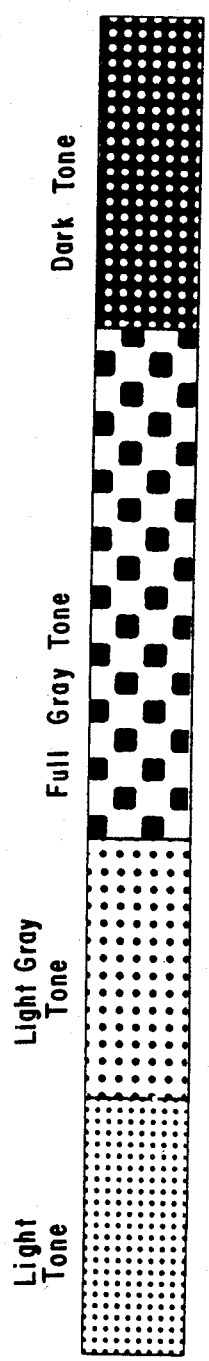
FIG. 4 is a greatly enlarged segmented, schematic view of a background as would be produced by the present invention.
Figure 2:
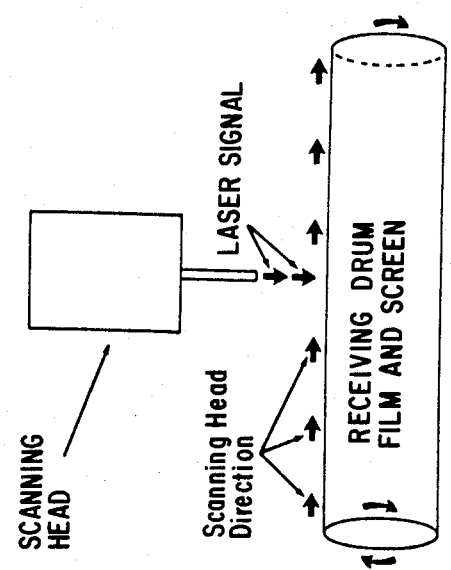
FIG. 2 illustrates one of the steps of the present invention wherein a continuous tone step tablet is scanned by a scanning head of an electronic laser scanning device.

A continuous tone step tablet negative is placed on the scanning drum and enlarged from 225% of original size to 1800% of original size to fill an area of 5½ by 8½ inches to 12 by 18 inches. Convention lithographic film is positioned on a receiver drum to receive light impulses from the scanning of the laser scanning device. A convention photo mechanical screen of 133 lines per square inch (for example) is placed over the piece of lithographic film. The image of the continuous tone step tablet negative is transfer-scanned to the film. A range of 80% printed dot image to 5% printed dot image are transmitted which is recorded by the passage of density imputed by the continuous scale being scanned. A light tone is made up of dots such as seen on the lefthand side of FIG. 4, larger dots are produced in the gray tone regions and white dots with black background are produced in the dark tone regions.

The positioning of the continuous tone step tablet positive on the scanning drum will create a vignetted image running vertically or horizontally as desired. The amount of printable dot percentage can be changed when starting point of density scan is set at the appropriate density of the step tablet.

In order to achieve a reproduction of any one particular printed color, the process is repeatedly performed on different pieces of film utilizing four different cross line sets of screens such as blue, red, yellow and black. An adjustment of exposure of photographic light impulses from the scanning head will create the different sizes of dot structure present in the screens to ensure a different printing tone in each color. Each screen angle can be different such as black 81°, magenta −51°, cyan 111°, and yellow 96°. Color variations are achieved by the placing of different printable dots of different colors from recorded densities and starting points of the step tablet. When printed over each other, the different printable dots of different colors produce a final desired color.

Of course, the background surrounds an image of a particular object. The piece of film can be masked at a desired location with a mask appropriate to the image of the object so that the background completely surrounds the object image. Because the process is entirely mechanical and does not rely on the artistry or skill of a particular artist, multiple backgrounds on the same printed page can be identically made. Further, identical backgrounds or matched backgrounds can be made at any time by simply duplicating the position and particular continuous tone step tablet negative and the particular screens and enlargement percentage used.

It is readily apparent that the above-described method for making matched backgrounds meets all of the objects mentioned above and also has the advantage of wide commercial utility. It should be understood that the specific form of the invention hereinabove described is intended to be representative only, as certain modifications within the scope of these teachings will be apparent to those skilled in the art of the grahpic arts industry.

Accordingly, reference should be made to the following claims in the determining the full scope of the invention

What is claimed:

1. Method for making matched backgrounds for images of objects, said backgrounds having continuously varied gradations of tone, said method comprising:
    (a) positioning a continuous tone step tablet negative on a scanning drum of a laser scanning device,
    (b) positioning a piece of lithographic film on a receiving drum of the laser scanning device,
    (c) positioning a first photo mechanical screen over said piece of film,
    (d) transfer scanning an image of said continuous tone step tablet negative to the piece of film through the screen while enlarging from 225% to 1800% of original size, and
    (e) repeating steps (b)–(d) using differing screen angles for producing sufficient plates for desired color combination, and
    (f) developing the pieces of film treated in steps (b)–(e).

2. The method of claim 1, further comprising between steps (b) and (c) the step of:
    masking said piece of film at a desired location with a mask appropriate to the image of the object.

3. The method of claim 1, further comprising after step (f) the step of printing the developed pieces of film each with a different color ink to produce said backgrounds.

4. The method of claim 2, further comprising after step (f) the step of printing the developed pieces of film each with a different color ink to produce said backgrounds.

* * * * *